(12) United States Patent
McTeer

(10) Patent No.: US 6,204,166 B1
(45) Date of Patent: *Mar. 20, 2001

(54) METHOD FOR FORMING DUAL DAMASCENE STRUCTURES

(75) Inventor: Allen McTeer, Meridian, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/137,525

(22) Filed: Aug. 21, 1998

(51) Int. Cl.[7] .................................................. H01L 21/441
(52) U.S. Cl. ........................ 438/624; 438/625; 438/688; 438/642; 438/656
(58) Field of Search ..................................... 430/312, 313, 430/314, 315, 319, 320, 311; 437/40, 44, 22; 438/624, 625; 653/637; 652/618; 648/622; 683/631; 675/642, 643, 645, 688

(56) References Cited

U.S. PATENT DOCUMENTS

| 5,126,006 | | 6/1992 | Cronin et al. . | |
|---|---|---|---|---|
| 5,244,837 | | 9/1993 | Dennison . | |
| 5,370,973 | * | 12/1994 | Nishii | 430/315 |
| 5,466,639 | | 11/1995 | Ireland . | |
| 5,543,253 | * | 8/1996 | Park et al. | 439/5 |
| 5,651,855 | | 7/1997 | Dennison et al. . | |
| 5,677,089 | * | 10/1997 | Park et al. | 430/5 |
| 5,726,100 | | 3/1998 | Givens . | |
| 5,904,565 | * | 5/1999 | Nguyen et al. | 438/687 |
| 5,976,928 | * | 11/1999 | Kirlin | 438/240 |
| 5,981,374 | * | 11/1999 | Dalal et al. | 438/624 |

OTHER PUBLICATIONS

Kaanta, Carter W., et al., Dual Damascene: A ULSI Wiring Technology, Jun. 11–12, 1991 VMIC Conference, pp. 144–152.

* cited by examiner

Primary Examiner—Charles Bowers
Assistant Examiner—Laura Schillinger
(74) Attorney, Agent, or Firm—Dickstein Shapiro Morin & Ohinsky LLP

(57) ABSTRACT

A method for forming Dual Damascene structures wherein a via is etched to an element to be contacted, a non-photoreactive protective layer is deposited in the via, and an intersecting trench is formed. The protective layer is then removed, together with any residual debris resulting from the trench formation. The protective layer enhances reliability of the electrical contact at the bottom of the via.

30 Claims, 7 Drawing Sheets

METHOD FOR FORMING DUAL DAMASCENE STRUCTURES

FIELD OF THE INVENTION

This invention relates to semiconductor processing methods for imparting electrical contacts and multi-level electrical interconnection to integrated circuits.

BACKGROUND OF THE INVENTION

In the manufacture of ultra large scale integrated circuits (ULSI), such as 4 megabit and up dynamic random access memories (DRAMs), one approach is to use an inlaid wiring technology known in the art as "Dual Damascene" technology, as described in Kaanta, C. W., et al., "Dual Damascene: A ULSI Wiring Technology," IBM General Technology Division, Essex Junction, Vermont, *VMIC Conference,* Jun. 11–12, 1991, pp. 144–152.

One Dual Damascene process utilizes first and second successive etching steps in order to arrive at a trough and via geometry within a surrounding insulating layer formed on the surface of a silicon wafer. The first etch step forms a trough which extends down to a controlled depth within the insulating layer. The second etch step extends the depth of the trough down to the active devices within the silicon substrate to form the via.

Another Dual Damascene process utilizes a first etch step to form a via through the insulating layer to the active devices within the substrate. To form the trench, a second layer of resist is then patterned over the insulating layer leaving the via exposed. The insulating layer is again etched, although not completely, thereby creating a trench in the insulating layer but no additional contacts to the substrate.

In each of the above Dual Damascene processes, after formation of the via and trench geometry a layer of conductive material is then blanket deposited over the surface of the insulating layer, and the wafer is planarized to leave conductive material within the via and trench.

Various problems are associated with the processes described above. One problem arises because the insulating layer is first etched to completely, or partially, form the via and then a second patterned resist layer is formed and the insulating layer is again etched. The subsequent etch results in the formation of non-volatile carbon-based debris in the bottom of the via. Due to the small size of the via, it is very difficult to completely remove the debris, and thus the conductive material which contacts the active device within the substrate may not make adequate electrical contact. In addition, two-step via fabrication processes, wherein the via is partially completed with the first etch, and then fully etched to expose the substrate during a subsequent trough etch, are inherently prone to producing non-uniform vias.

An approach to avoiding the above problems is to first etch a via to expose the substrate below a first insulating layer, then deposit and planarize a first metal layer to form a metal plug to the substrate. A second insulating layer having a trench is then patterned over the first metal layer and the first insulating layer. Next, a second metal layer is formed over the second insulating layer and then planarized. This approach, however, requires the formation and planarization of two insulating layers and two metal layers, thus adding multiple additional steps and an additional metal-to-metal interface, which also can be difficult to form reliably.

What is needed is a reliable and efficient Dual Damascene process, which provides uniform vias and avoids via debris and other problems which can result in inadequate electrical contact.

SUMMARY OF THE INVENTION

The present invention provides a process for forming vias and trenches for metalization and multi-level electrical interconnection in ULSI using a single metal deposition and a minimum of process steps for each interconnection.

According to the method of the invention, an insulator layer is deposited over a conductive substrate or device to be contacted. A via is then etched in the insulator layer to outwardly expose a surface of the conductive substrate. A non-photoreactive protective layer, preferably an organic anti-reflective coating, is then deposited in the via, followed by a photoreactive layer to pattern the line. A trench is then patterned and etched in the insulator layer and in communication with the via. The protective layer is then removed from the via, together with any residual debris resulting from the trench etch. A metal or other conductive material is then deposited in the via and trench, and then planarized.

The above process steps can be repeated to form multiple levels of via contacts and trough interconnects using a non-photoreactive layer to protect the via during the trench etch.

DETAILED DESCRIPTION OF THE PREFERRED EMBODIMENTS

An exemplary construction of a fabrication process for forming via contacts and trough interconnects according to one embodiment of the present invention is described below. It is to be understood, however, that this process is only one example of many possible processes. For example, while in the description below, the via contact forms an electrical communication to a first metal layer atop a substrate, the via may also make electrically contact directly with active devices or other operable regions of the substrate. In addition, the protective layer may be any non-photoreactive material, although an anti-reflective coating is preferred. Negative photoresists and any other materials that do not develop out during the trench fabrication steps may be used. The invention is not intended to be limited by the particular process described below.

Figure 5:
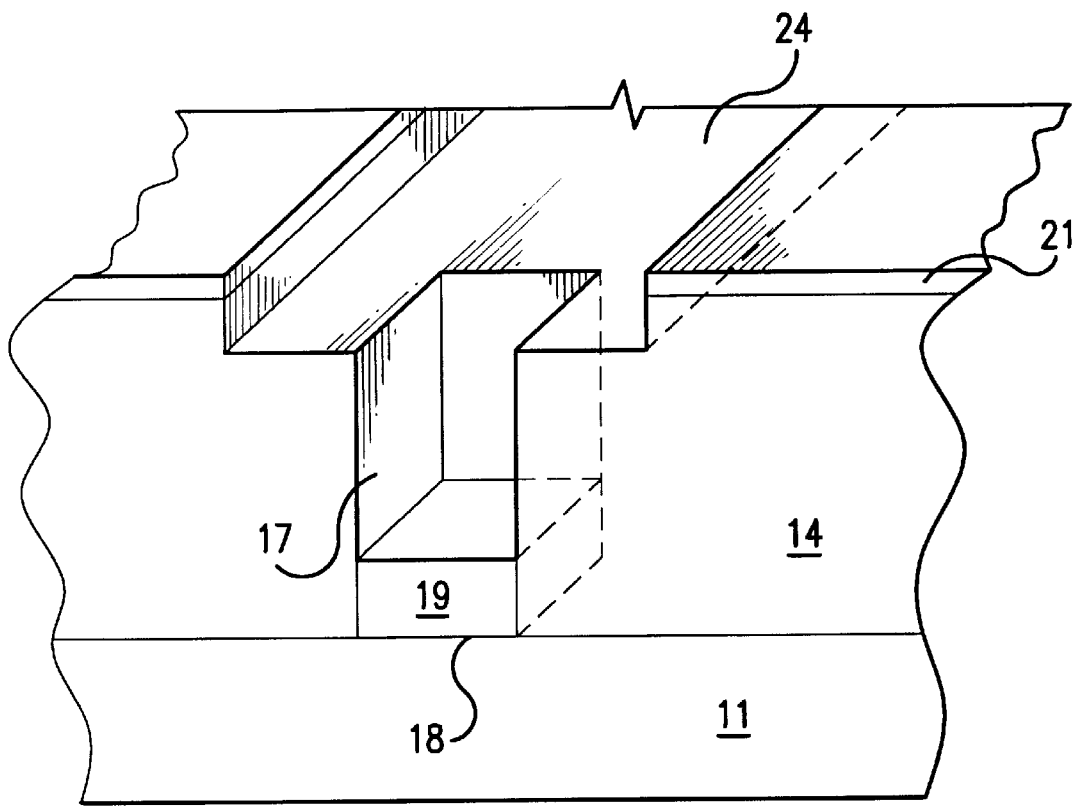
FIG. 5 is a diagrammatic cross-sectional view of a portion of a semiconductor wafer at a processing step subsequent to that shown in FIG. 4.
Figure 6:
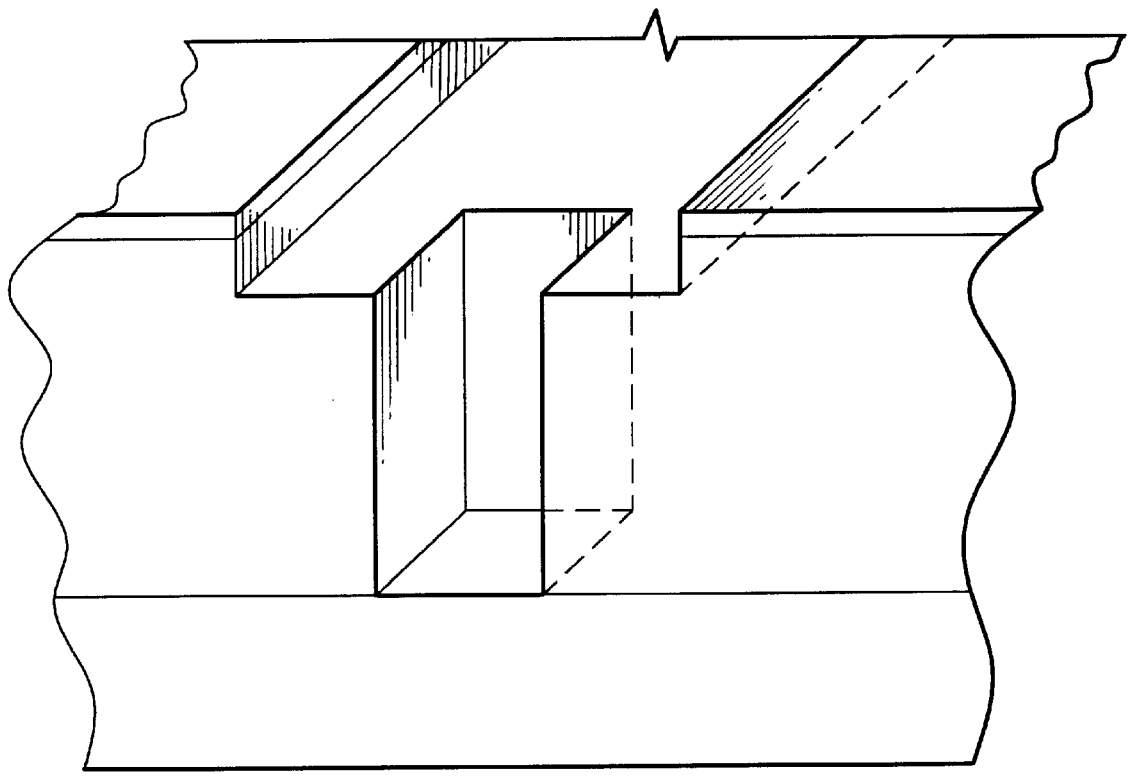
FIG. 6 is a diagrammatic cross-sectional view of a portion of a semiconductor wafer at a processing step subsequent to that shown in FIG. 5.
Figure 7:
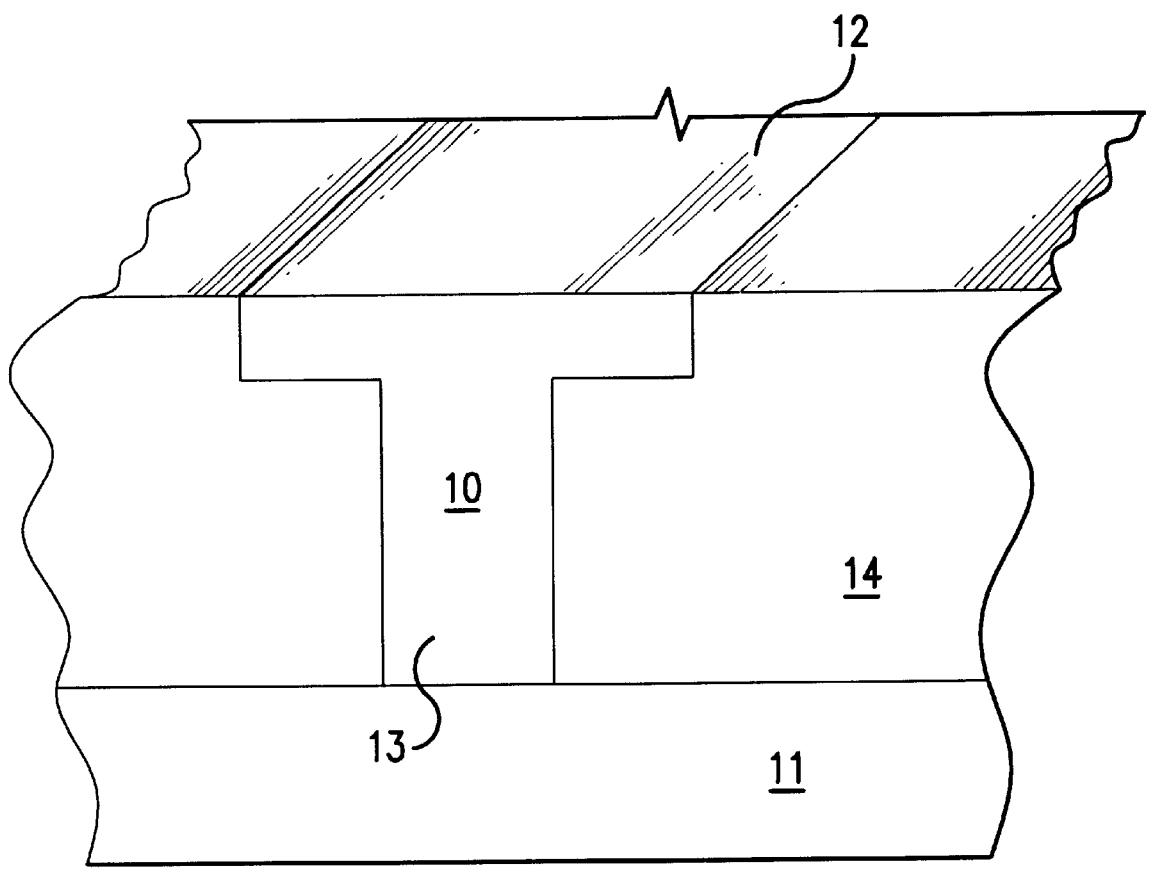
FIG. 7 is a diagrammatic cross-sectional view of a portion of a semiconductor wafer at a processing step subsequent to that shown in FIG. 6.

FIGS. 1–7 present a sequence of steps for constructing a wafer as shown in fragmentary view in FIG. 7. The wafer comprises an electrically conductive path 10 and an electrically conductive layer 11, the path 10 includes a horizontal interconnect 12 and a vertical contact 13, the contact 13 providing electrical connection between the interconnect 12 and the electrically conductive layer 11. The wafer also includes a substrate (not shown) which supports the foregoing components of the wafer, and an insulator layer or dielectric 14 which rests upon the electrically conductive layer 11. The term "substrate" herein shall be understood to mean one or more insulative, conductive or semiconductive layers or structures which may include active or operable portions of semiconductor devices. The substrate will typically include one or more insulative layers of etchable material. By way of example, the insulator layer 14 may be constructed of silicon dioxide. The conductive layer 11 is typically constructed of a metal, such as aluminum, tungsten or copper, and may also be fabricated of a non-metallic conductive material, such as polysilicon. Also, the contact 13 and the interconnect 12 are constructed preferably of a metal such as aluminum or tungsten, or a non-metallic conductive material such as polysilicon.

Figure 1:
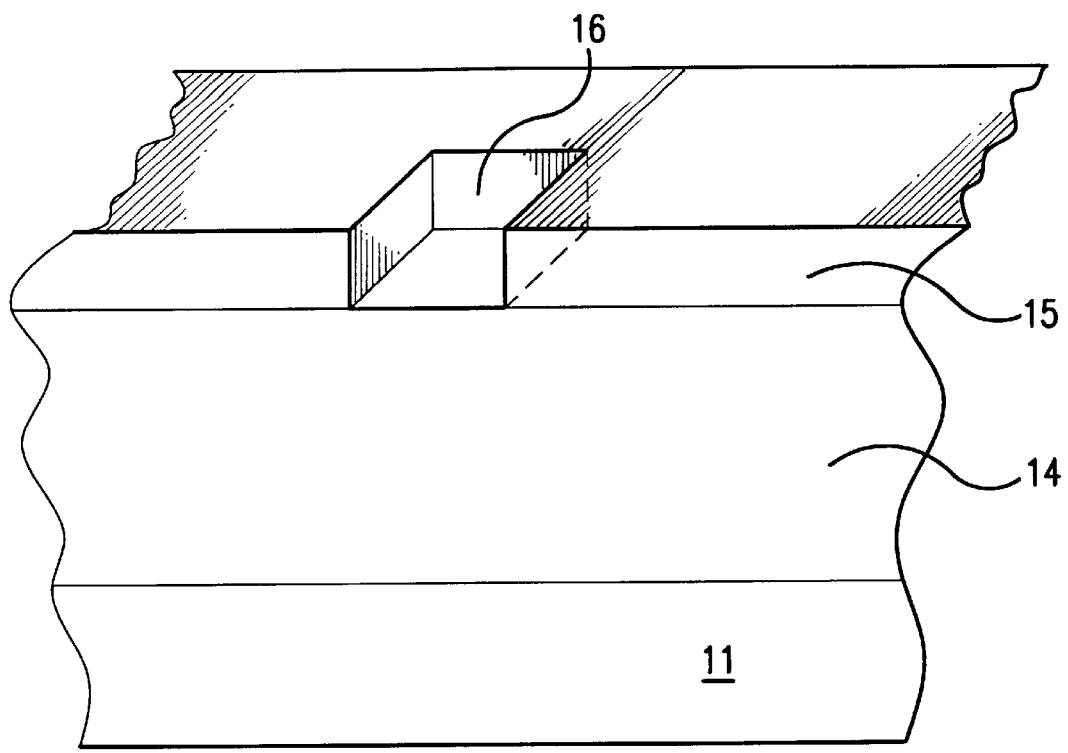
FIG. 1 is a diagrammatic cross-sectional view of a portion of a semiconductor wafer at an early processing step according to one embodiment of the present invention.

The procedure for construction of the wafer begins in FIG. 1 with the deposition of the material of the insulator layer 14 upon the electrically conductive layer 11. A typical depth of the layer 14 is approximately 1.5 microns. To facilitate the description, the interface between the layer 14 and the conductive layer 11 is referred to as the bottom surface of the layer 14, the opposite surface being designated the top surface. Following the deposition of the material of layer 14, preferably the top surface of the layer 14 is then planarized to remove any undulations. Planarization may be conducted in conventional fashion by use of photoresist-RIE-etchback or chemical mechanical polishing (CMP) of the top surface of layer 14. During the planarization step, the thickness of the layer 14 is typically reduced to approximately 1.3 microns. This is followed by deposition of a layer of photoresist 15 on the top of the top surface of layer 14. Using a mask and well-established photolithography steps, an opening 16 is created in the photoresist 15, the opening extending through the layer of photoresist 15 down to the top surface of the layer 14.

Figure 2:
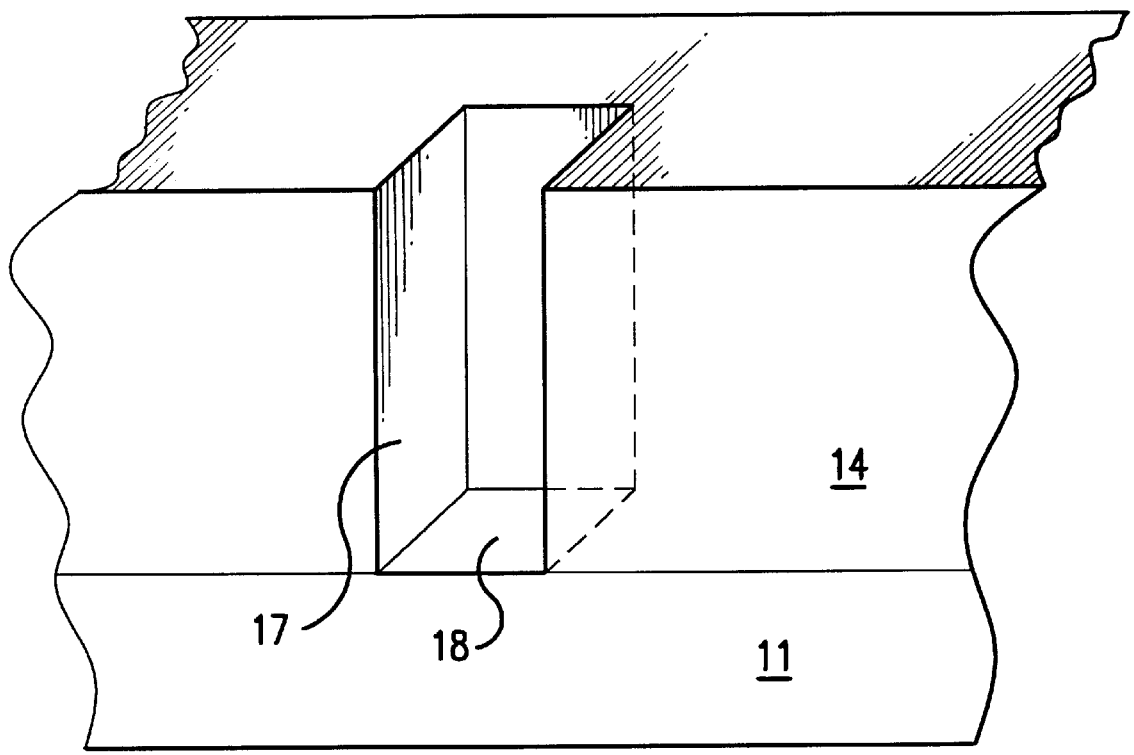
FIG. 2 is a diagrammatic cross-sectional view of a portion of a semiconductor wafer at a processing step subsequent to that shown in FIG. 1.

Referring now to FIG. 2, an oxide etch, for example, is applied to create via 17. Via 17 extends from the top surface of insulator layer 14 to the bottom surface of layer 14 and exposes a portion of the surface 18 of the electrically conductive layer 11. The layer of photoresist 15 is then removed, resulting in the structure shown in FIG. 2.

Figure 3:
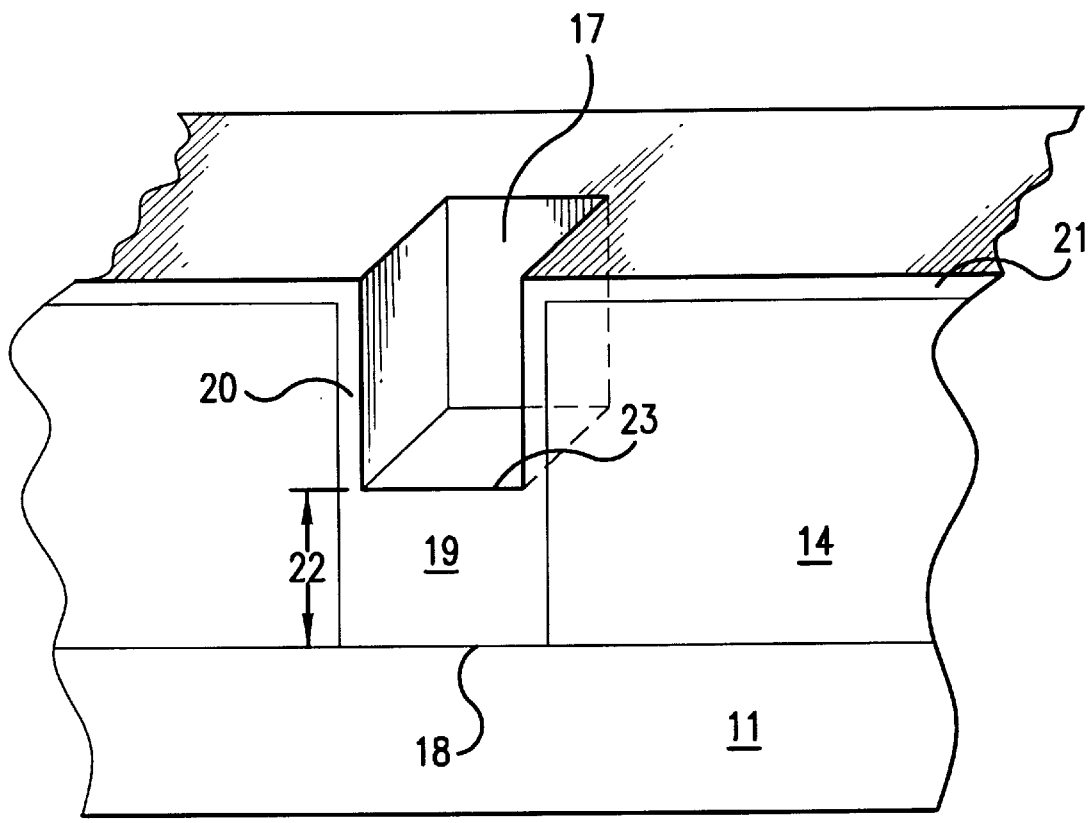
FIG. 3 is a diagrammatic cross-sectional view of a portion of a semiconductor wafer at a processing step subsequent to that shown in FIG. 2.

The procedure continues, as shown in FIG. 3, by forming a protective layer 19 within via 17. The protective layer 19 covers the exposed surface 18 of the electrically conductive layer 11 in via 17 during subsequent trench etch and processing. The protective layer 19 may be any material which will not develop out during the subsequent photoprocessing steps and, preferably, is comprised of an organic anti-reflective coating (ARC). Layer 19 may also comprise a negative photoresist, or any other material that is not photoreactive. With vias having a relatively small geometry, the protective layer 19 preferably fills the via. Large, vias may be partially filled, as illustrated in FIG. 3. The protective layer 19 will typically also form a coating 20 on the sidewalls of via 17, and a coating 21 on the top surface of insulator layer 14. It is preferred that the thickness of coatings 20 and 21 be less than the depth 22 of the protective layer 19. The protective layer 19 may be deposited by spinning onto the wafer, or by any other means suitable for applying a photoresist material. This procedure results in the structure shown in FIG. 3.

Figure 4:
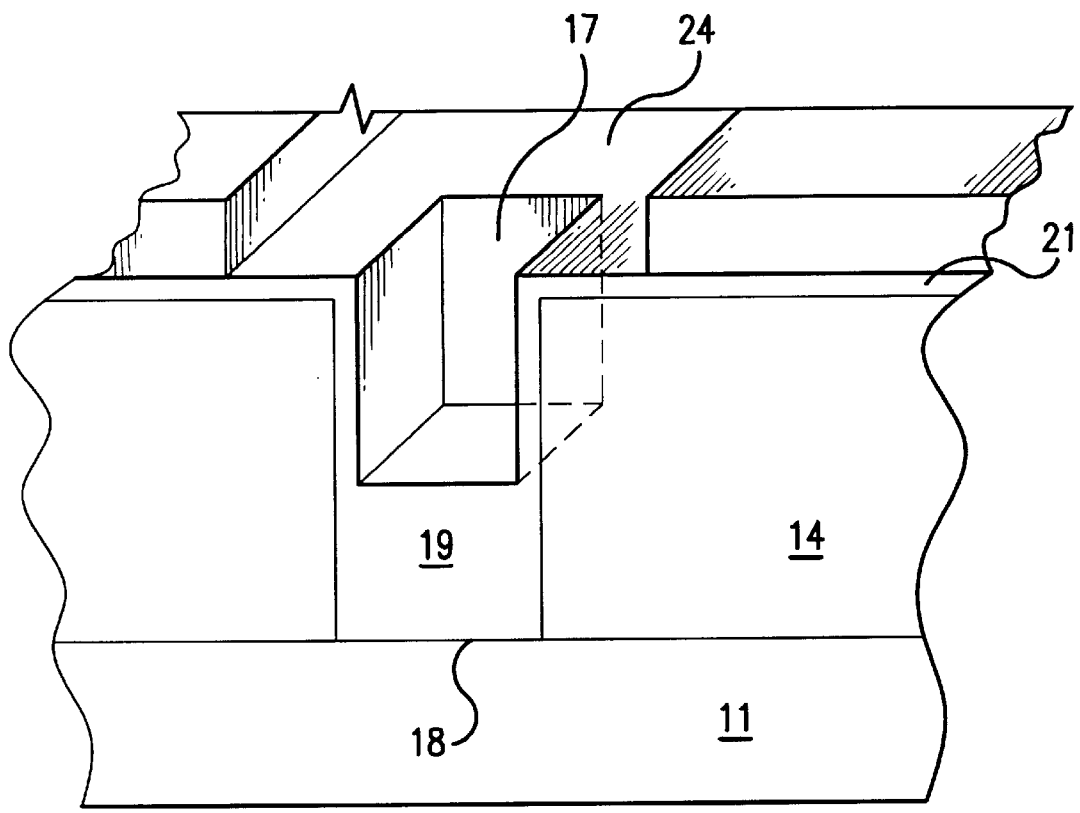
FIG. 4 is a diagrammatic cross-sectional view of a portion of a semiconductor wafer at a processing step subsequent to that shown in FIG. 3.

Referring now to FIG. 4, a second photoresist layer 24 is then applied to the coating 21 of protective layer 19 by masking and use of a developer. Photoresist layer 24 is preferably a positive photoresist. If negataive resist is used to form the pattern then positive resist can be used for the protective film. The insulator layer 14 is then partially etched by reactive ion etching (RIE) or other suitable means to form a horizontal trough 24 at the location of the via 17. The etchant should etch the oxide or the material of insulator layer 14 selectively with respect to the anti-reflective coating or other material of the protective layer 19. Accordingly, the etchant used to create the trough 24 does not completely remove the protective layer 19 from the bottom of via 17. This selective etch produces the structure shown in FIG. 5.

As shown in FIG. 5, oversizing of the trough 24 in the direction transverse to the via 17 allows for some misalignment among the masks of the via and trench photolithography processes so that, even if the trough mask is not centered along an axis of via 17, an adequate opening can still be created. With respect to misalignment of the mask in the longitudinal direction of the trough 24, the trough 24 extends for a sufficient distance beyond the via 17 to insure an adequate area of intersection of the via 17 with the trough 24. The via can also be fabricated to an oversized width in the transverse direction of the via 17 to allow for some misalignment among the masks so that even if the trough is not over-sized, and not centered along an axis of the via, an adequate opening can still be created. Alternatively, the via and trough can both be fabricated without any oversizing.

The procedure continues with a stripping off of photoresist layer 24 and an etching of the protective layer 19 at the bottom of via 17 and coating 21, as shown in FIG. 5. If an organic anti-reflective coating is used as the protective layer 19, removal is preferably accomplished in situ by use of an oxide plasma etch. Alternatively, any post ash treatment or wet cleanse removal process can be used where suitable for the various types of protective layers that may be used. In FIG. 6, the photoresist layer 24 has been stripped and the residual protective layer 19 has been removed from the bottom of via 17.

The via 17 and trough 24 are next filled with an electrically-conductive material, preferably a metal such as that employed in the construction of the conductive layer 11. For example, in the event that the conductive layer 11 is constructed of aluminum, then the via 17 and the trough 24 are filled with aluminum by physical or chemical vapor deposition, or by electroplating if copper. The metal in the trough 24 is then planarized down to the top surface of the insulator layer 14. This produces the structure of the portion of the wafer shown in FIG. 7. The portion of the metal 10 deposited within the via 17 has become the stud of a contact 13 to the underlying metal 11; the portion of the metal deposited in the trough 24 has become the interconnect 12.

The above process steps can be repeated in succession a plurality of times in order to fabricate multiple levels of via contacts and trough interconnects to form multi-level ULSI circuits.

The above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method for forming a recess in a substrate representing a semiconductor interconnect via and trough pattern, comprising:
   forming a layer of etchable material;
   removing a portion of said etchable material to form a via;
   forming a protective layer within and along the bottom of said via, said protective layer protecting said bottom of said via from debris;
   removing a portion of said etchable material to form a trough transverse to and intersecting an upper portion of said via; and
   removing from said via said protective layer and said debris.

2. The method of claim 1 wherein said protective layer is a non-photoreactive material.

3. The method of claim 1 wherein said protective layer is selected from the group consisting of anti-reflective coatings and negative photoresists.

4. The method of claim 1 wherein said protective layer is an organic anti-reflective coating and said step of removing said layer comprises an oxide plasma etch.

5. The method of claim 1 wherein said layer of etchable material is an electrically insulative material and is formed on an underlying electrically conductive material.

6. The method of claim 5 wherein said step of removing a portion of said etchable material to form a via exposes at least a portion of said electrically conductive material.

7. The method of claim 6 wherein said step of forming a protective layer within said via comprises the further step of forming said protective layer upon said exposed portion of said electrically conductive material.

8. The method of claim 1 wherein said step of forming a protective layer within said via further comprises the step of forming a coating of said protective layer on said etchable material adjacent to said via.

9. The method of claim 8 wherein the thickness of said coating is less than the thickness of said protective layer in said via.

10. The method of claim 1 wherein said step of removing a portion of said etchable material to form a trough further comprises the step of applying an etch which etches said etchable material at a rate faster than the rate with which said etch etches said protective layer.

11. The method of claim 1 further comprising the step of planarizing said layer of etchable material before the step of forming a protective layer within said via.

12. The method of claim 1 further comprising the step of filling the recess at least partially with an electrically conductive material.

13. The method of claim 12 wherein said step of filling the recess provides for an overfilling of the conductive material to extend over said layer of etchable material.

14. The method of claim 13 further comprising the step of planarizing at least a portion of said conductive material which has overflowed said layer of etchable material.

15. The method of claim 1 wherein said layer of etchable material is an oxide.

16. The method of claim 12, wherein the process steps are repeated through a plurality of layers of etchable materials to form a multi-level integrated circuit.

17. A method for forming a contact to a semiconductor device feature, comprising the steps of:
   forming a dielectric layer over a feature to be contacted;
   forming a first layer of photoresist over said dielectric layer;
   patterning said first layer of photoresist and etching said dielectric layer to form a via through said dielectric to outwardly expose a contact surface of said device feature;
   forming a layer of non-photoreactive material within and along the bottom of said via and atop said outwardly exposed contact surface of said device feature, said non-photoreactive material protecting said bottom of said via from debris;
   forming a second layer of photoresist over said dielectric layer and non-photoreactive material;
   patterning said second layer of photoresist and etching said dielectric layer to form a trough intersecting the upper portion of said via;
   removing from said via said non-photoreactive layer and photoresist, and said debris;
   forming a conductive layer within said via and trough and in contact with said outwardly exposed contact surface of said device feature.

18. The method of claim 17 wherein said non-photoreactive layer is an anti-reflective coating material.

19. The method of claim 17 wherein said non-photoreactive layer is a negative photoresist.

20. The method of claim 17 wherein said step of forming a protective layer atop said outwardly exposed surface does not completely fill said via.

21. The method of claim 17 wherein the step of removing said non-photoreactive layer comprises applying an oxide plasma which removes said layer and at least a portion of any said debris which results from said step of etching to form said trough.

22. The method of claim 17 wherein the step of etching said dielectric layer to form a trough comprises applying a selective etch which does not completely remove said non-photoreactive layer.

23. The method of claim 17 wherein said second layer of photoresist is a positive photoresist and said non-photoreactive layer is a negative photoresist.

24. The method of claim 17 further comprising the step of planarizing said conductive layer.

25. The method of claim 24 wherein the steps are repeated through at least two dielectric layers to form a multilevel contact to one or more semiconductor device features.

26. A method for forming a semiconductor via contact and trough interconnect to an underlying substrate, comprising:
   forming a first layer of electrically insulative material on an electrically conductive material of an underlying substrate;
   etching a portion of said insulative material to form a via and outwardly exposing a portion of said electrically conductive material;
   forming a protective coating within and along the bottom of said via and atop said exposed portion of electrically conductive material, said coating protecting said bottom of said via from debris;
   applying a selective etch to remove a portion of said etchable material to form a trough transverse to and intersecting an upper portion of said via and removing a portion of said protective coating;
   removing from said via the remaining portion of said protective coating and photoresist, and said debris; and
   applying a conductive material to fill said via and trough.

27. The method of claim 26 wherein said protective coating is an anti-reflective coating.

28. The method of claim 27 wherein said step of removing the remaining portion of said protective coating comprises applying an oxide plasma.

29. The method of claim 26 comprising the further step of planarizing said conductive material in said via and trough.

30. The method of claim 29 wherein the process steps are repeated to form multi-level interconnects in a multi-level integrated circuit.

* * * * *